(12) United States Patent
Hu

(10) Patent No.: US 6,753,584 B1
(45) Date of Patent: Jun. 22, 2004

(54) ANTIREFLECTIVE COATING LAYER

(75) Inventor: Yongjun Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/476,558

(22) Filed: Jan. 3, 2000

Related U.S. Application Data

(62) Division of application No. 08/918,690, filed on Aug. 21, 1997.

(51) Int. Cl.$^7$ .......................................... H01L 31/0232
(52) U.S. Cl. .......................... 257/437; 438/48; 438/72; 438/636
(58) Field of Search ........................................ 257/437

(56) References Cited

U.S. PATENT DOCUMENTS

| | | | |
|---|---|---|---|
| 4,436,608 A | | 3/1984 | Bennett et al. ............. 214/265 |
| 4,899,202 A | | 2/1990 | Blake et al. ............... 357/23.7 |
| 5,047,131 A | * | 9/1991 | Wolfe et al. ........... 204/192.23 |
| 5,116,427 A | * | 5/1992 | Fan et al. .................... 136/259 |
| 5,464,711 A | | 11/1995 | Mogab et al. ................. 430/5 |
| 5,552,180 A | * | 9/1996 | Finley et al. ............... 427/165 |
| 5,886,391 A | * | 3/1999 | Niroomand et al. ........ 257/510 |
| 5,965,942 A | | 10/1999 | Itoh et al. ................... 257/761 |

* cited by examiner

Primary Examiner—Long Pham
Assistant Examiner—Wai-Sing Louie

(74) Attorney, Agent, or Firm—Workman Nydegger

(57) ABSTRACT

Antireflective structures according to the present invention comprise a metal silicon nitride composition in a layer that is superposed upon a layer to be patterned that would other wise cause destructive reflectivity during photoresist patterning. The antireflective structure has the ability to absorb light used during photoresist patterning. The antireflective structure also has the ability to scatter unabsorbed light into patterns and intensities that are ineffective to photoresist material exposed to the patterns and intensities.

Preferred antireflective structures of the present invention comprise a semiconductor substrate having thereon at least one layer of a silicon-containing metal or silicon-containing metal nitride. The semiconductor substrate will preferably have thereon a feature size with width dimension less than about 0.5 microns, and more preferably less than about 0.25 microns.

One preferred material for the inventive antireflective layer includes metal silicon nitride ternary compounds of the general formula $M_xSi_yN_z$ wherein M is at least one transition metal, x is less than y, and z is in a range from about 0 to about 5y. Preferably, the Si will exceed M by about a factor of two. Addition of N is controlled by the ratio in the sputtering gas such as Ar/N. Tungsten is a preferred transition metal in the fabrication of the inventive antireflective coating. A preferred tungsten silicide target will have a composition of silicon between 1 and 4 in stoichiometric ratio to tungsten. Composite antireflective layers made of metal silicide binary compounds or metal silicon nitride ternary compounds may be fashioned according to the present invention depending upon a specific application.

25 Claims, 4 Drawing Sheets

ANTIREFLECTIVE COATING LAYER

RELATED APPLICATIONS

This is a divisional application of U.S. patent application Ser. No. 08/918,690, filed Aug. 21, 1997, titled Antireflective Coating Layer and Method of Making, now abandoned, which is incorporated herein by reference.

BACKGROUND OF THE INVENTION

1. The Field of the Invention

The present invention relates to the fabrication of integrated circuits. More particularly, the present invention relates to an anti-reflective enhancement for integrated circuit fabrication. In particular, the present invention relates to an anti-reflective enhancement for reducing critical dimension loss during mask patterning. More particularly, the present invention relates to formation of a metal silicon nitride antireflective coating layer that resist "foot poisoning" of a masking layer and its detrimental effects.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the microelectronics industry, the process of miniaturization entails shrinking the size of individual semiconductor devices and crowding more semiconductor devices within a given unit area. With miniaturization, problems arise such as proper electrical isolation between components. Attempts to isolate components from each other in the prior art arm constrained by photolithographic limits of about 0.25 microns. One way to form structures that electrically isolate conductive materials on a semiconductor substrate from each other is to use photolithography in patterning dielectrics layers upon the semiconductor substrate.

To form a metallization wiring layer on a semiconductor substrate by photolithography, a photoresist mask is used to pattern the metallization wiring layer. The mask has directed therethrough a beam of light, such as ultraviolet (UV) light and deep UV (DUV) light (~250 nm), to transfer a pattern through an imaging lens from a photolithographic template to a photoresist coating which has been applied to the structural layer being patterned. The pattern of the photolithographic template includes opaque and transparent regions with selected shapes that match, respectively, openings and intact portions intended to be formed into the photoresist coating. The photolithographic template is conventionally designed by computer assisted drafting and is of a much larger size than the semiconductor substrate on which the photoresist coating is located. Light is directed through the photolithographic template and is focused on the photoresist coating in a manner that reduces the pattern of the photolithographic template to the size of the photolithographic coating and that develops the portions of the photoresist coating that are unasked and are intended to remain. The undeveloped portions are thereafter remove. Other photolithographic techniques for formation of device features are also possible.

As dimensions shrink below about 0.25 microns, the prior art technique of forming metallization wiring layers becomes more difficult to achieve. Light that is reflected during exposure of a photoresist tends to blur the boundary between two metallization lines and the space therebetween. This blur can cause wider metallization lines than designed, which excessive width will either bridge and short out the circuit or will cause unwanted "cross talk" such that the device is rendered defective.

In general, the blurred edge of a critically dimensioned photoresist layer caused by reflected light in photolithographic techniques also result in problems in contact corridors, vias, wiring trenches, and isolation trenches, where the dimensions are patterned below about 0.25 microns. For example, a contact corridor that is too wide will cause notching into a gate stack during a contact corridor etch. Notching causes encroachment into conductive areas of an adjacent gate stack and filling the contact corridor with metallization material can cause a short to occur between the contact and the conductive elements of the adjacent gate stack. A wiring trench that is too wide will cause "cross talk" with the wiring in a neighboring trench so as so to compromise and accuracy of the integrated circuit associated therewith.

The resolution with which a pattern can be transferred to the photoresist coating from the photolithographic template is currently limited in commercial applications to widths of about 0.25 microns. In turn, the dimensions of the openings and intact regions of the photoresist mask, and consequently the dimensions of the shaped structures that are formed with the use of the photoresist mask, are correspondingly limited. Photolithographic resolution limits are thus a barrier to further miniaturization of integrated circuits. Accordingly, a need exists for an improved method of forming semiconductor device features that have a size that is reduced from what can be formed with conventional photolithography.

During photolithography, reflected light that occurs during exposure of a mask tends to blur the desired image because the reflected light escapes beyond exposed regions on the photoresist. The blurring problem is caused by reflected light affecting areas of the photoresist that are outside the design pattern.

FIG. 1 illustrates the problem of blurring caused by reflected light that occurs during exposure of a photoresist. A semiconductor structure 10 may be, for example, a semiconductor substrate 12 that was designed to have a width D, but due to blurring caused by reflectivity of patterning light from structures beneath the photoresist, semiconductor substrate 12 has an actual width A. The variance between design width D and actual width A is illustrated as the distance 2(B/2) or B. By way of example, semiconductor substrate 12 was designed to have a width D of 10 in arbitrary units, but due to blurring caused from reflectivity, the actual width A is nine in arbitrary units. It can be seen that a ten percent variance between design and actual width has occurred.

As miniaturization technology continues, a blurring variance of B as illustrated in FIG. 1 will increase relative to an ever-decreasing design width D. Thus, as also illustrated in FIG. 1, a miniaturized semiconductor substrate 12' that may have a design width D' of to two and one-half in arbitrary units but with the variance of B, will have the effect of causing a 40 percent error. A variance of B may leave insufficient space upon miniaturized semiconductor substrate 12' to form desired contacts or structures. It can be seen from the demonstration illustrated in FIG. 1 that the need to eliminate or substantially reduce blurring must keep pace with miniaturization.

Another hindrance to photolithographic limitations are conventional antireflective coating (ARC) schemes. Prior art methods for avoiding reflected light and its photoresist blurring problems include using layers such as titanium nitride or organic materials that reduce the reflected light in order to better control resolution of the photoresist. As the ever-increasing pressure to miniaturize bears upon the microelectronics industry, the conventional antireflective enhancements such as a titanium nitride layer, organic layers, or other layers known in the art are proving inadequate at resolutions below about 0.25 microns.

One problem at a dimension below about 0.25 microns is that of fouling caused by titanium nitride or organic materials. Fouling is defined as a tendency for a selected antireflective layer to resist staying within preferred boundaries. Resistance to staying within preferred boundaries tends to cause photolithographic techniques to be compromised.

When the ARC is a polymer film, it is applied directly to the semiconductor structure to a thickness of about 0.5 microns and photoresist is deposited on top of the ARC. The ARC then has the function of absorbing most of the radiation used during exposure of the photoresist that penetrates the photoresist material. Both standing wave effects and destructive scattering of light due to topographical features are suppressed with use of the ARC. A disadvantage of a polymer film ARC is that the process is increased in complexity and dimensional control may be lost. A polymer film ARC requires application by spin coating of the ARC material and pre-baking of same before applying the photoresist material. A problem of removing the ARC exists following an etch. For example, during anisotropic etching, portions of a photoresist are mobilized and form a liner within a recess that is being etched that further assists in achieving the anisotropic etch. Due to the anisotropic etch, however, the photoresist that was mobilized may have mingled with other elements that cause it to resist removal by conventional stripping techniques. This resistance to stripping requires stripping solutions that have a chemical intensity that may detrimentally effect the structure that was achieved during the anisotropic etch. As such, use of a substance that is intended to aid anti-reflectivity can result in the benefit thereof being mitigated by the requirement of a more chemically intensive stripping solution treatment.

Various attempts have been made to form antireflective coatings in order to further enhance miniaturization. One type of antireflective coating that has been developed includes metal nitrides, such as titanium nitride, and metal silicon nitrides. The prior art use of metal silicon nitrides and metal nitrides was developed for resolution limits at or above about 1.0 microns. At that resolution limit, there was little or no concern about the phenomenon called "foot poisoning" of the photoresist. Foot poisoning is the phenomenon of diffusion of a constituent of the antireflective layer out of the antireflective layer and into the photoresist material. Foot poisoning has the problem of changing the physical qualities of the photoresist material during processing so as to cause the photoresist material immediately adjacent to the antireflective layer to spread or otherwise change. FIGS. 2–4 illustrate the phenomenon of foot poisoning as it develops during photoresist processing. In FIG. 2 it can be seen that semiconductor structure 10 includes semiconductor substrate 12. Upon semiconductor substrate 12 there may be an insulation layer 14 such as borophosphosilicate glass (BPSG), or a silicate formed from tetmethylortosilicate (MOS) decomposition, or the like. Upon insulation layer 14 there is disposed a metallization layer 16 that is to be patterned into a system of superficial metallization lines. A prior art metal silicide or metal silicon nitride antireflective layer 18 is disposed upon metallization layer 16 and a masking layer 20 is disposed upon antireflective layer 18.

During processing of masking layer, as seen in FIG. 3, a critical dimension $D_C$ is formed by exposing masking layer 20 to form a patterned mask 22. During curing of patterned mask 22, nitrogen diffuses from antireflective layer 18 into patterned mask 22 and causes patterned mask 22 to expand at the interface between patterned mask 22 and antireflective layer 18. As seen in FIG. 4, patterned mask 22 has formed a foot-poisoned mask 24 in which the critical dimension DC has been lost and an actual dimension, $D_A$ has resulted. When critical dimensions are in the range of about 0.5 to 1 microns, foot poisoning may not be a major concern. However, the trend of miniaturization has progressed to the point at which a resulting $D_A$ in lieu of $D_C$ is an undesirable variance. The need to reduce or eliminate foot poisoning can be appreciated as analogous to the need to reduce or eliminate blurring as illustrated in FIG. 1. In other words, foot poisoning effects must be reduced in a manner that keeps pace with the process of miniaturization.

Another method of attempting to avoid reflected light is to use a metallic mask. Metallic materials, however, can cause contamination of the semiconductor structure beneath due to the high mobility of metal ions in wet chemical environments or in dry-etch vapors. Additionally, although a metallic mask may remain as part of a finished semiconductor structure, a metallic mask may not be able to properly withstand high processing temperatures sometimes required to achieve a preferred semiconductor structure.

What is needed is an antireflective coating scheme that does not substantially add to fabrication cost and does not substantially reduce fabrication yield. What is also needed is an antireflective coating scheme that imparts an antireflective quality to photolithographic techniques not previously achieved in the prior art. What is also needed is an antireflective coating scheme that does not cause fouling of the semiconductor structure. Additionally, what is needed is an antireflective coating scheme that either does not require removal, or that can be removed without causing contamination or damage to the semiconductor structure. What is also needed is an antireflective coating scheme that facilitates a better photoresist profile and better control of critical dimensions due to better prevention of reflected light than is found in the prior art. What is also needed is an antireflective coating scheme that, while resisting reflecting light, resists foot poisoning of the photoresist during processing.

SUMMARY OF THE INVENTION

Antireflective structures according to the present invention comprise a metal silicon nitride composition in a layer that is superposed upon a layer to be patterned that would other wise cause destructive reflectivity during photoresist patterning. The antireflective structure has the ability to absorb light used during photoresist patterning. The antireflective structure also has the ability to scatter unabsorbed light into patterns and intensities that are substantially ineffective to photoresist material exposed to the patterns and intensities.

Preferred antireflective structures of the present invention comprise a semiconductor substrate having thereon at least one layer of a silicon-containing metallic or silicon-containing metal nitride. The antireflective layer either absorbs reflected light or dissipates reflected light into patterns and intensities that do not substantially alter photoresist material that is exposed to the patterns and intensities. The semiconductor substrate will preferably have thereon a feature size with width dimension less than about 0.5 microns, and more preferably less than about 0.25 microns.

An antireflective structure according to the present invention comprises an antireflective layer that resists fouling of the semiconductor structure such as photoresist foot poisoning and that has the ability to absorb light or to scatter light into patterns and intensities that do not substantially effect photoresist material that is exposed by those patterns and intensities.

One preferred material for the inventive antireflective layer includes metal silicon nitrides. The metal silicon nitrides are of the general formula $M_xSi_yN_z$ wherein M is at least one transition metal, x is less than y, and z is in a range from about 0 to about 5y. Preferably, the Si will exceed M by about a factor of two. Addition of N is controlled by the ratio in the sputtering gas used in physical vapor deposition (PVD) to deposit the metal silicon nitride material, such as Ar/N.

Minimum reflectivity may be manipulated by adjusting the thickness of the antireflective layer. Minimum reflectivity may also be manipulated by nitrogen content in the inventive antireflective layer.

Tungsten is a preferred transition metal in the fabrication of the inventive antireflective coating. A preferred tungsten silicide target for the PVD process will have a composition of silicon between 1 and 4 in stoichiometric ratio to tungsten.

The inventive antireflective layer is amorphous or has a preferable grain size that is less than the film thickness of the antireflective layer. A grain size that is substantially the same or larger than the film thickness of the inventive antireflective layer will cause a substantially discontinuous film to form. A substantially discontinuous film will detrimentally allow for reflected light to escape from the metallization layer that is to be patterned.

Composite antireflective layers made of metal suicides or metal silicon nitrides may be fashioned according to the present invention depending upon a specific application.

Another type of composite antireflective layer may be made according to present invention in which antireflective layers made of metal silicides or metal silicon nitrides may be combined with rough or hemispherical grained polysilicon. In this embodiment, it may be advantageous to use the polysilicon as a later-used conductive layer such as the conductive material in a word line or as an etch stop structure.

The reflectivity exhibited by antireflective structures of the present invention can be described as the fraction of incident light energy that escapes from the surface of the antireflective structure when irradiated by photoresist patterning light under normal operating conditions.

In connection with preferred materials and preferred reflectivities of selected structures, it is also useful to describe the present invention in terms of a variance from the design geometry of an actual characteristic geometry of the structure being fabricated. It can be appreciated that, as integrated circuit device geometries continue to shrink, the variance preferably either remains relatively constant or must also shrink.

The method of the present invention may be used to form various structures such as metallization layers. It is to be understood that the discussion of metallization layers is merely illustrative and not limiting of the inventive method. For example, isolation trenches, contact corridors, vias, stacked storage node wells, and wiring trenches arc further non-limiting examples of sties that may also be formed by the inventive method and by use of the inventive antireflective structure.

BRIEF DESCRIPTION OF THE DRAWINGS

In order to illustrate the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Preferred antireflective structures of the present invention comprise a semiconductor substrate having thereon at least one layer of a silicon-containing metallic or silicon-containing metal nitride material. The antireflective layer either absorbs reflected light or dissipates reflected light into patterns and intensities that do not substantially alter photoresist material that is exposed to the patterns and intensities. The semiconductor substrate will preferably have thereon a feature size having a width dimension less than about 0.5 microns, and more preferably less than about 0.25 microns.

Materials

An antireflective structure according to the present invention comprises an antireflective layer that resists fouling of the semiconductor structure such as photoresist foot poisoning and that has the ability to absorb light or to scatter light into patterns and intensities that do not substantially affect photoresist material that is exposed by those patterns and intensities.

Preferred material for the inventive antireflective layer includes metal silicon nitrides. The metal silicon nitrides arm of the general formula $M_xSi_yN_z$ wherein M is at least one transition metal, x is less than y, and z is in a range from about 0 to about 5y. Preferably, the Si will exceed M by about a factor of two. Particular preferred embodiments include y=2, y=2.55, and z=2.7. For transition metals, the at least one transition metal is preferably a refractory metal such as Sc, Ti, Zr, Nb, Ta, Mo, W, Co, or Ni. Additionally, the transition metal M may include a combination such as $Ti_rW_{1-r}$, $W_rAl_{1-r}$, or $Ti_rAl_{1-r}$ wherein r is in the range from 0 to about 1. The N in the preferred metal silicon nitrides is added to the antireflective layer during sputtering of, for example a tungsten silicide target or a pair of targets, one of tungsten and one of silicon. Addition of N is controlled by the ratio in the sputtering gas such as $Ar/N_2$. Examples of Ar/N flow ratios used in the inventive method include $Ar/N_2$ 30/10, 30/20, 30/30, 30/40, and 30/50. Flow rates are in standard cubic centimeters per minute (sccm). Thus, 30/20 represents 30 sccm Ar and 20 sccm $N_2$.

As it has been found that the presence of Si aids in resisting $N_2$ diffusion from the antireflective layer into the photoresist, a relationship is maintained that generally relates an increase of $N_2$ in the sputtering gas to an increase in Si in the net sputtering target. Thus, under similar sputtering conditions, the amount of N produced in an antireflective layer according to the present invention in a $WSi_2$ or a $WSi_{2.55}$ target will preferably be less than the amount of N produced in an antireflective layer in a $WSi_{2.7}$ target.

Figure 5:
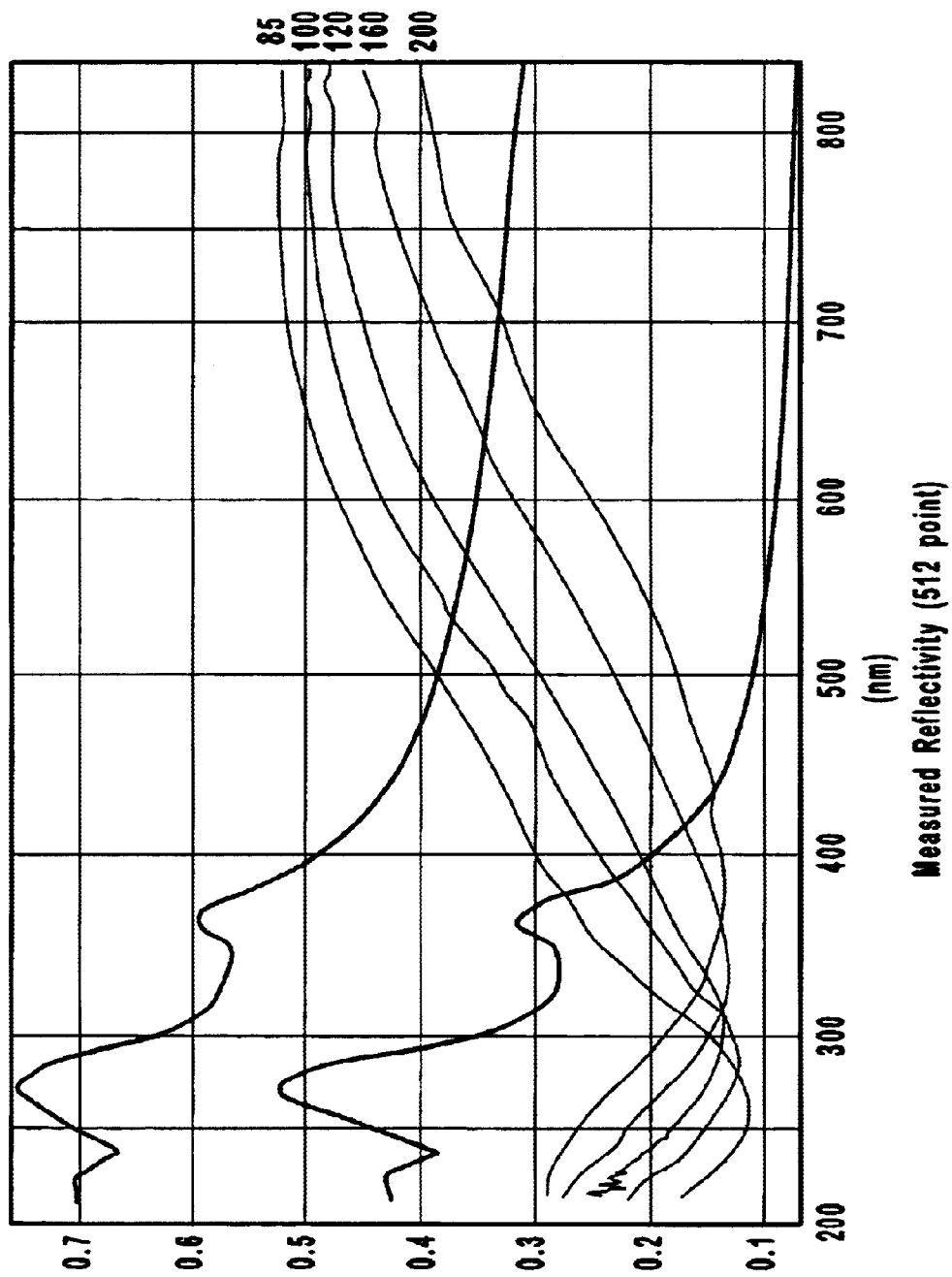
FIG. 5 is a graph of the fraction of total reflectivity as a function of wavelength for a metal silicon nitride antireflective layer of a given chemical makeup for a series of varying thicknesses.

FIG. 5 is an illustration of measured reflectivity of total incident light as a function of light wavelength. In FIG. 5, five antireflective layers are depicted according to their specific measured reflectivities. The five antireflective layers have similar chemical compositions but have varying thicknesses. The curves in FIG. 5 are labeled with reference numerals 85 through 200. Each reference numeral corresponds to a thickness of the inventive antireflective layer in Angstrom units (Å). The inventive antireflective layer was made by sputtering a titanium silicide target comprising a $TiSi_{2.55}$ composition. Sputtering was carried out under the conditions of one kilowatt sputtering power, 400–700 volts sputtering potential, and a 30/20 $Ar/N_2$ sccm flow rate and ratio. The 200 Å thick antireflective layer was sputtered at 1 kW for ten seconds; the 160 Å thick antireflective layer was sputtered at 1 kW for eight seconds; the 120 Å thick antireflective layer was sputtered at 1 kW for six seconds; the 100 Å thick antireflective layer was sputtered at 1 kW for five seconds; and the 85 Å thick antireflective layer was sputtered at 0.8 kW and five seconds.

A simple linear regression of the observed approximate minimum reflectivities of the antireflective layers illustrated in FIG. 5 demonstrates a substantially linear relationship between thickness of the inventive antireflective layer and minimum reflectivity. The 85 Å film has the minimum reflectivity right at the DUV wavelength (~250 nm).

Figure 6:
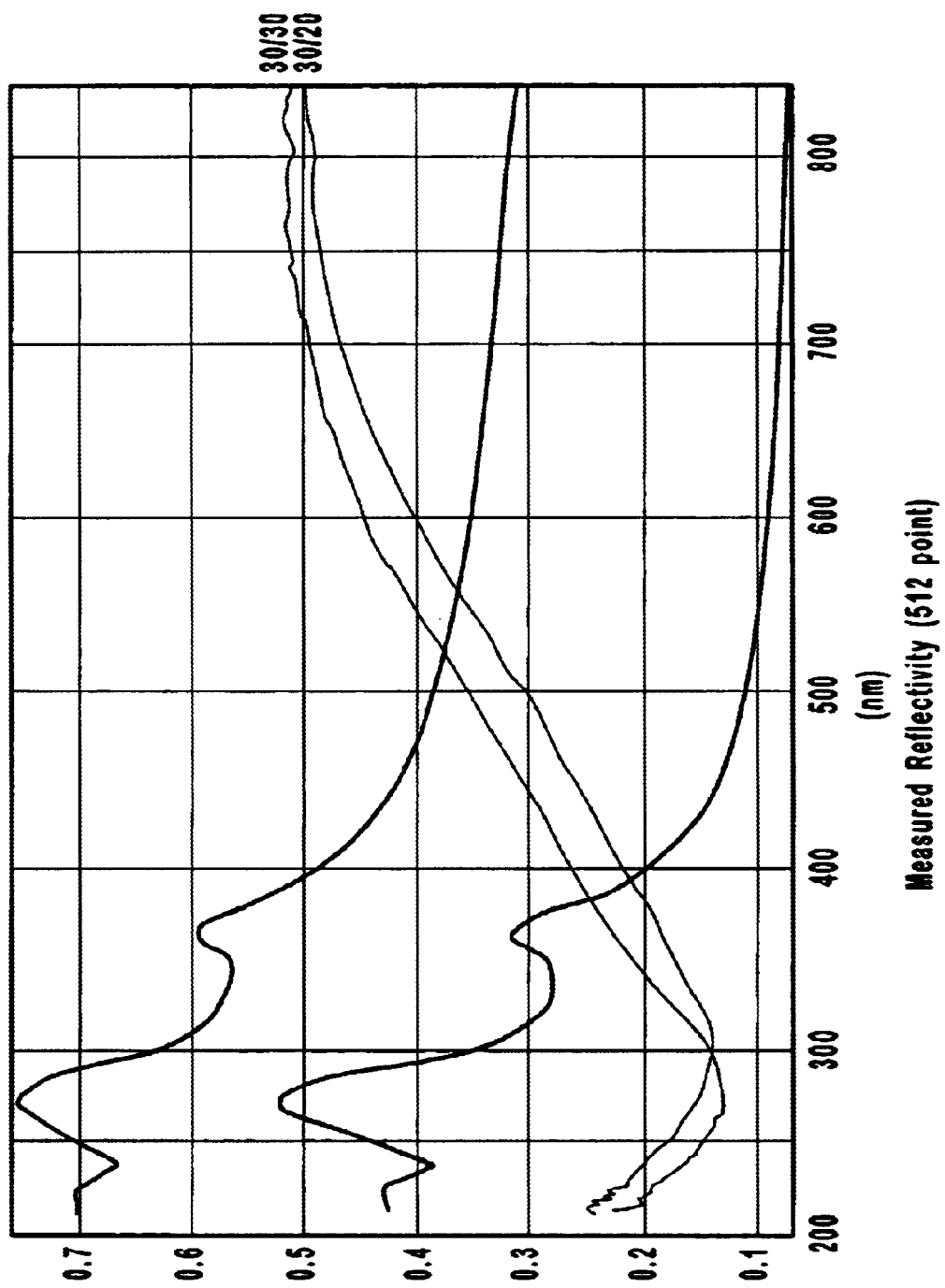
FIG. 6 is a graph of the fraction of total reflectivity as a function of wavelength that illustrates the effect of measured reflectivity for antireflective layers that differ in nitrogen processing conditions during formation of the antireflective layer.

Minimum reflectivity may also be manipulated by nitrogen content in the inventive antireflective layer. FIG. 6 illustrates measured reflectivity of two inventive antireflective layers, each having a thickness of about 120 Å, but having differing concentrations of nitrogen therein. Each antireflective layer was fabricated under the conditions of 1 kW sputtering power, six seconds sputtering time, and a $WSi_{2.55}$ tungsten silicide sputtering target. The sputtering conditions variable was the nitrogen content in the sputtering gas as illustrated by curves 30/30 and 30/20. It can be seen that sputtering with a higher nitrogen ratio in the sputtering gas for a 120 Å thick antireflective layer fabricated will have a lower minimum reflectivity than sputtering with a 30/20 $Ar/N_2$ ratio. It also has a lower wavelength towards DUV at this minimum reflectivity.

Tungsten is a preferred transition metal in the fabrication of the inventive antireflective coating. Tungsten is preferred because of its ability to form fine (i.e. less than 5 nm) grains of tungsten silicon nitride. Tungsten is also preferred because at a grain size of 5 nm or smaller, tungsten grains are substantially amorphous.

A preferred tungsten silicide target will have a composition of silicon between 1 and 4 in stoichiometric ratio to tungsten. A more preferred tungsten silicide target will have a composition of silicon between 2 and 4 in stoichiometric ratio to tungsten. Another preferred target will have a silicon to tungsten ratio between 3 and 4. Commercially available tungsten silicide targets may be used and sputtered at different voltage potentials in order to achieve a preferred sputtering ratio of tungsten to silicon. For example, a low energy sputtering, e.g. a sputtering at a potential between 400 and 700 volts at 1 kW, will tend to have a less preferential sputtering between the tungsten and silicon components in the target. At higher energy sputterings, preferential sputtering for tungsten over silicon may occur.

The inventive antireflective layer has a preferable grain size that is less than the film thickness of the antireflective layer. A grain size that is substantially the same or larger than the film thickness of the inventive antireflective layer will cause a substantially discontinuous film to form. A substantially discontinuous film will allow for reflected light to escape from, for example, the metallization layer 16 that is to be patterned.

It can now be appreciated that a grain size that is substantially 5 nm or less and/or substantially amorphous such as including tungsten, fabricated under the conditions set forth in the specification, can be found using other refractory or transition metals by reading the specification and by routine experimentation.

Structures

Composite antireflective layers made of metal silicides or metal silicon nitrides may be fashioned according to the present invention depending upon a specific application. In many applications, it is presupposed that a metallization layer such as metallization layer 16 is being overlayed with the inventive antireflective layer.

Another type of composite antireflective layer may be made according to present invention in which antireflective layers made of metal suicides or metal silicon nitrides may be combined with rough or hemispherical grained polysilicon. In this embodiment, it may be advantageous to use polysilicon as a later-used conductive layer such as the conductive material in a word line or as an etch stop structure.

Reflectivity

The reflectivity exhibited by antireflective structures of the present invention can be described as the fraction of incident light energy that escapes from the surface of the antireflective structure when irradiated by photoresist patterning light under normal operating conditions. Various ways of describing reflectivity may be expressed. For example, a simple fraction of incident light energy may be given for a preferred reflectivity as illustrated in FIGS. 5 and 6. A preferred reflectivity for the present invention is in a range from about 0 to about 30 percent, more preferably from about 5 to about 20 percent, and most preferably from about 10 to about 15 percent.

FIG. 5 illustrates the reflectivity of metal silicon nitride antireflective layers as a function of incident light wavelength. Standard conditions for the antireflective layers include fabrication thereof from a $WSi_{2.55}$ target with a sputtering gas flow ratio of Ar/N of 30/20. In each case, sputtering was carried out under 1 kW power conditions, and sputtering times were varied in order to achieve a selected range of thicknesses. It can be seen from the reflectivity curves in FIG. 5 that minimal reflectivity for antireflective layers made of metal silicon nitride material is a function of layer thickness for the layer thickness tested. Linear regression of approximate minimal reflectivity as a function of layer thickness reveals a substantially linear relationship therebetween. It can also be seen that the minimal reflectivity of the inventive metal silicon nitride antireflective layers is in the DUV wavelength range of below about 400 nm.

A second set of antireflective layers was made to discover the effect of nitrogen content therein upon reflectivity. FIG. 6 illustrates two antireflective layers of metal silicon nitrides that were made from a $WSi_{2.55}$ target with sputtering gas flow ratios of Ar/N of 30/20 and 30/30. As it can be observed, the antireflective layer that was sputtered from a $WSi_{2.55}$ target with a sputtering gas flow ratio of Ar/N of 30/20 has a lower overall reflectivity than the antireflective layer that was sputtered from a $WSi_{2.55}$ target with a sputtering gas flow ratio of Ar/N 30/30. The same trend can also be used with increasing silicon content in a tungsten silicide target.

By understanding the relationships illustrated in FIGS. 5 and 6, materials may be selected by using such relationships as, for example, the Beer-Lambert law:

$$I=I_0 \exp(-\in \rho d) \quad (1)$$

where I is the reflected light intensity, $I_0$ is the initial light intensity, $\in$ is the black-body degree of opacity or light extinction coefficient of the material, $\rho$ is the density of the material, and d is the measured distance from the surface of the antireflective structure to a detector.

It can be appreciated that various metal silicon nitride combinations can be selected and tested that can be compared with the antireflective layers taught herein. It can be further appreciated that one of ordinary skill in the art will be able to select from fouling-resistant, light-dissipating, and light-absorbing combinations, and that a relationship between $\rho$ and $\in$ can be used to choose equivalent materials to those that are disclosed herein.

Blurring Effects

Figure 1:
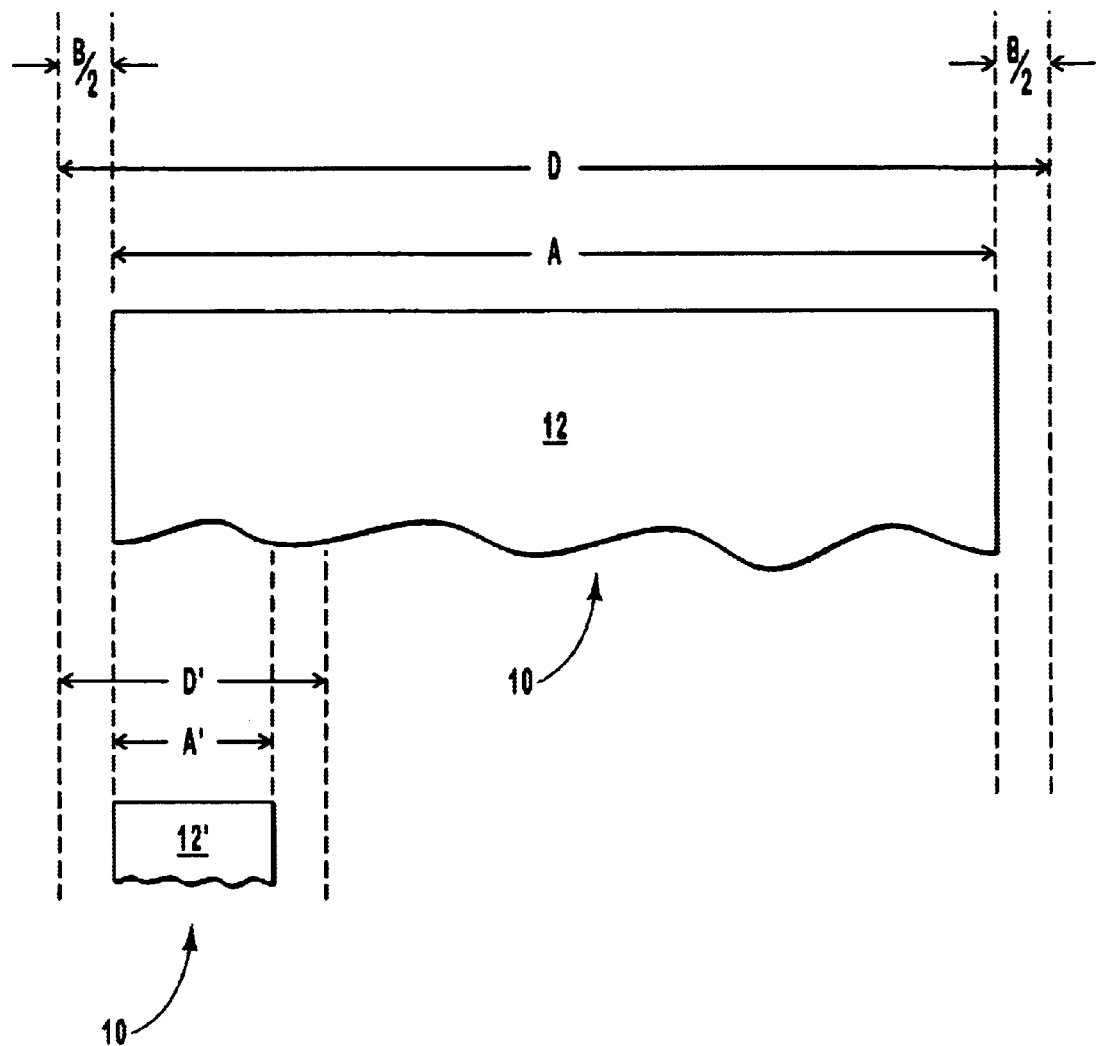
FIG. 1 is an elevational cross-section view of a semiconductor structure, illustrating the variance between a design dimension and an achieved dimension caused by the blurring effect of reflected light in the distortion of sub-micron critical dimensions in conventional photolithography.
Figure 2:
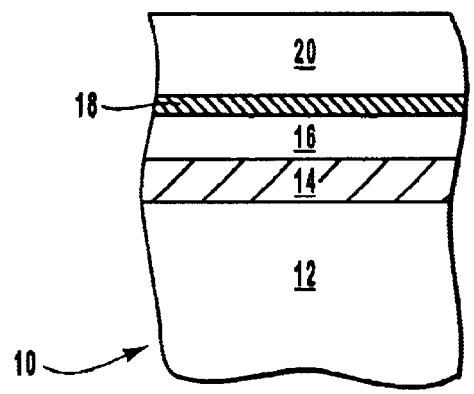
FIG. 2 is an elevation cross-section view of a semiconductor structure wherein an insulation layer is disposed upon a semiconductor substrate, a layer of metallization is disposed upon the insulation layer, an antireflective layer is disposed upon the layer of metallization, and a masking layer is disposed upon the antireflective layer.
Figure 3:
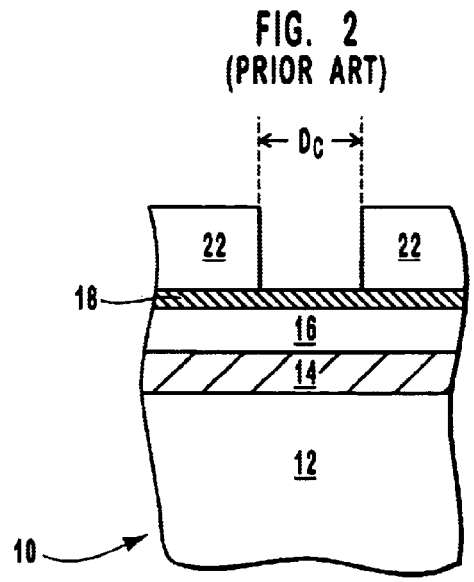
FIG. 3 is an elevation cross-section view of the semiconductor structure depicted in FIG. 2, wherein the masking layer has been patterned to form a patterned mask with an ideal patterned critical dimension.
Figure 4:
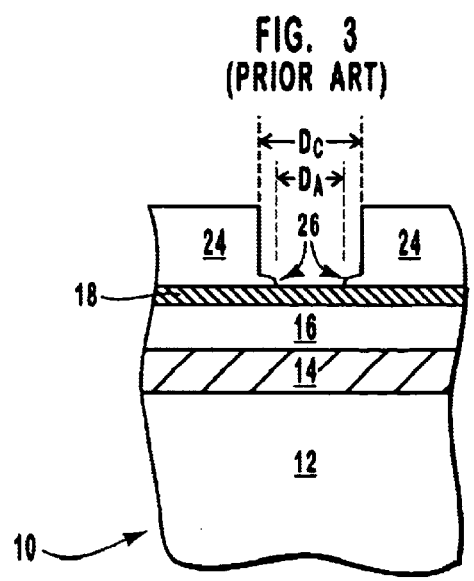
FIG. 4 is an elevation cross-section view of the semiconductor structure in FIG. 2, wherein the masking layer has been patterned to form a patterned mask, and wherein the phenomenon of foot poisoning is illustrated such that a critical dimension has been altered.

In connection with preferred materials and preferred reflectivities of selected structures, it is also useful to describe the present invention in terms of a variance from the design geometry of an actual characteristic geometry of the structure being fabricated. A mask may be designed with a first preferred characteristic geometry and, as illustrated in FIG. 1, the actual geometry exposed in photolithography will vary from the design geometry. With geometries contemplated by the present invention, a variance of less than 10 percent is preferred and a variation of less than 5 percent is most preferred. It can be appreciated that, as integrated circuit device geometries continue to shrink, the variance preferably either remains relatively constant or must also shrink.

Applications

The method of the present invention may be used to form various structures with preferred geometries such as metallization layers. It is to be understood that the discussion of metallization layers is merely illustrative and not limiting of the inventive method. For example, isolation trenches, contact corridors, vias, stacked storage node wells, and wiring trenches are further non-limiting examples of structures that may also be formed by the inventive method and by use of the inventive antireflective structure.

Preferred geometries of the present invention are geometries below 0.25 microns. More preferred geometries achieved by using the inventive antireflective layer are geometries below about 0.22 microns. Even more preferred geometries are below 0.2 microns. Highly preferred geometries are achieved below 0.1 microns, and the present invention may be used to achieve patterning geometries of about 0.07 microns.

The present invention may be embodied in other specific forms without departing from its spirit or essential characteristics. The described embodiments are to be considered in all respects only as illustrative and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A semiconductor structure comprising:
  a semiconductor substrate; and
  an antireflective coating over the semiconductor substrate, the antireflective coating comprising a metal silicon nitride compound, the metal being at least one metal selected from the group consisting of scandium, and cobalt, wherein the antireflective coating is configured to minimize reflectivity of deep ultraviolet light.

2. The semiconductor structure as defined in claim 1, wherein the antireflective coating has a thickness range from about 25 Angstroms to about 1,000 Angstroms.

3. The semiconductor structure as defined in claim 1, wherein:
  the antireflective coating has a film thickness; and
  the antireflective coating is amorphous or has a grain size that is less than the film thickness.

4. The semiconductor structure as defined in claim 1, wherein the metal silicon nitride compound is $M_xSi_yN_z$, M is a metal, x is greater than zero, y is greater than 2x, and z is in a range from about 1y to about 5y.

5. The semiconductor structure as defined in claim 4, wherein z is in a range from about 1y to about 2y.

6. The semiconductor structure as defined in claim 4, wherein the antireflective coating further comprises hemispherical grained polysilicon.

7. The semiconductor structure as defined in claim 1, wherein the antireflective coating reflects incident light energy in a reflectivity that is in a range from 0 percent to about 30 percent.

8. The semiconductor structure as defined in claim 1, wherein:

the antireflective coating is upon a formation that is selected from the group consisting of an isolation trench, a contact corridor, a via, a stacked storage node well, and a wiring trench.

9. A semiconductor structure comprising:

a semiconductor substrate; and an antireflective coating upon said semiconductor substrate, the antireflective coating comprising a metal silicon nitride compound $M_xSi_yN_z$, wherein:

x is greater than zero;

y is greater than x;

z is greater than zero and less than about 5y;

M is at least two transition metals $M1_rM2_{1-r}$;

r is in a range between 0 and 1;

M1 and M2 are selected from the group consisting of Sc, Zr, Nb, Ta, Mo, Co, Al, and Ni; and M1 is not M2.

10. The semiconductor structure as defined in claim 9, wherein the antireflective coating has a thickness range from about 25 Angstroms to about 1,000 Angstroms.

11. The semiconductor structure as defined in claim 9, wherein the antireflective coating further comprises hemispherical grained polysilicon.

12. A semiconductor structure comprising:

an electrically insulative layer upon a semiconductor substrate;

a patterned electrically conductive metal line upon the electrically insulative layer; and an antireflective coating upon said electrically conductive metal line, wherein the antireflective coating is configured to minimize reflectivity of deep ultraviolet light, the antireflective coating comprising a metal silicon nitride compound $M_xSi_yN_z$ wherein:

x is greater than zero;

M is at least one transition metal selected from the group consisting of scandium, and cobalt;

y is greater than x; and z is greater than about 0 and less than about 5y.

13. The semiconductor structure as defined in claim 12, wherein the antireflective coating has a thickness range from about 25 Angstroms to about 1,000 Angstroms.

14. The semiconductor structure as defined in claim 12, wherein the antireflective coating further comprises hemispherical grained polysilicon.

15. A semiconductor structure comprising:

a semiconductor substrate; and an antireflective coating over the semiconductor substrate, the antireflective coating comprising a metal silicide compound, wherein the metal is at least one metal selected from the group consisting of Sc, Co, Al, and Ni.

16. The semiconductor structure as defined in claim 15, wherein:

the metal silicide compound is $M1_rM2_{1-r}Si_s$;

M1 and M2 are both said at least one metal and are selected from said group;

M1 is not M2;

r is in a range from 0 to 1; and s is greater than zero.

17. The semiconductor structure as defined in claim 15, wherein:

the metal silicide compound is $M_xSi_y$; and x is 1, and y is in a range from about 1.5 to about 5.

18. The semiconductor structure as defined in claim 15, wherein the antireflective coating further comprises hemispherical grained polysilicon.

19. The semiconductor structure as defined in claim 15, wherein:

the antireflective coating has a film thickness; and the antireflective coating is amorphous or has a grain size that is less than the film thickness.

20. The semiconductor structure as defined in claim 15, wherein the antireflective coating reflects incident light energy in a reflectivity that is in a range from 0 percent to about 30 percent.

21. The semiconductor structure as defined in claim 15, wherein:

the antireflective coating is upon a formation that is selected from the group consisting of an isolation trench, a contact corridor, a via, a stacked storage node well, and a wiring trench.

22. A semiconductor structure comprising:

a semiconductor substrate; and an antireflective coating over the semiconductor substrate, the antireflective coating comprising a metal silicon nitride compound selected from the group consisting of tungsten aluminum silicon nitride, and titanium aluminum silicon nitride.

23. A semiconductor structure comprising:

a semiconductor substrate; and an antireflective coating over the semiconductor substrate, the antireflective coating comprising a metal silicon nitride compound, wherein the metal is at least one metal selected from the group consisting of scandium, and cobalt.

24. A semiconductor structure comprising:

a semiconductor substrate; and an antireflective coating over the semiconductor substrate and having a thickness range from about 25 Angstroms to about 200 Angstroms, the antireflective coating comprising a metal silicon nitride compound, wherein the metal is at least one metal selected from the group consisting of scandium, and cobalt.

25. The semiconductor structure as defined in claim 24, wherein the antireflective coating has a thickness from about 85 Angstroms to about 200 Angstroms.

* * * * *

UNITED STATES PATENT AND TRADEMARK OFFICE
CERTIFICATE OF CORRECTION

PATENT NO. : 6,753,584 B1
DATED : June 22, 2004
INVENTOR(S) : Yongjun Hu

It is certified that error appears in the above-identified patent and that said Letters Patent is hereby corrected as shown below:

Title page,
Item [56], References Cited, U.S. PATENT DOCUMENTS, add the following:

| -- | | | |
|---|---|---|---|
| 5,604,157 | 2/1997 | Dai et al. | |
| 5,066,615 | 11/1991 | Brady, et al. | 437/229 |
| 5,106,786 | 4/1992 | Brady, et al. | 437/229 |
| 5,825,609 | 4/1996 | Andricacos et al. | 257/295 |
| 5,793,057 | 6/1995 | Summerfelt | 257/55 |
| 5,712,759 | 12/1995 | Saenger et al. | 361/321.4 |
| 5,641,985 | 6/1997 | Tamura et al. | 257/530 |
| 5,585,998 | 12/1996 | Kotecki et al. | 361/321.4 |
| 5,561,321 | 10/1996 | Hirano et al. | 257/700 |
| 5,558,944 | 9/1996 | Terunuma | 428/611 |
| 4,704,188 | 11/1987 | Carlson et al. | 156/656 |
| 4,609,903 | 9/1986 | Toyokura et al. | 338/22sd |
| 4,591,821 | 5/1986 | Paulson et al. | 338/308 |
| 4,213,781 | 7/1980 | Noreika et al. | 75/134p -- |

Item [57], ABSTRACT,
Line 23, change "Ar/N" to -- $Ar/N_2$ --

Column 1,
Line 67, after "thereafter" change "remove." to -- removed. --

Column 2,
Line 25, before "and accuracy" insert -- speed --

Column 3,
Line 43, after "detrimentally" change "effect" to -- affect --

Column 4,
Lines 1 and 2, change "tetmethylortosilicate (MOS)" to
-- tetraethlorthosilicate (TEOS) --
Line 16, after "dimension" change "DC" to -- $D_C$ --

Column 5,
Lines 25, change "Ar/N." to -- $Ar/N_2$. --
Line 44, change "suicides" to -- silicides --
Line 48, before "present" insert -- the --

UNITED STATES PATENT AND TRADEMARK OFFICE
CERTIFICATE OF CORRECTION

PATENT NO. : 6,753,584 B1
DATED : June 22, 2004
INVENTOR(S) : Yongjun Hu

It is certified that error appears in the above-identified patent and that said Letters Patent is hereby corrected as shown below:

Column 6,
Line 6, after "trenches" change "arc" to -- are --
Line 7, after "examples of" change "sites" to -- structures --

Column 7,
Line 26, before "flow ratios" change "Ar/N" to -- $Ar/N_2$ --

Column 9,
Line 15, after "flow ratio of" change "Ar/N" to -- $Ar/N_2$ --
Line 32, after "flow ratios of" change "Ar/N of 30/20and" to -- $Ar/N_2$ of 30/20 and --
Line 37, before "30/30" change "Ar/N" to -- $Ar/N_2$ --

Signed and Sealed this

Tenth Day of May, 2005

JON W. DUDAS
*Director of the United States Patent and Trademark Office*